United States Patent [19]
Hasegawa

[11] Patent Number: 6,046,623
[45] Date of Patent: *Apr. 4, 2000

[54] SIGNAL DETECTING CIRCUIT

[75] Inventor: Kazuo Hasegawa, Miyagi-ken, Japan

[73] Assignee: Alps Electric Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/969,983

[22] Filed: Nov. 13, 1997

[30] Foreign Application Priority Data

Nov. 13, 1996 [JP] Japan .................................. 8-318688

[51] Int. Cl.⁷ .................................................. G01N 27/22
[52] U.S. Cl. ........................ 327/509; 327/478; 327/514; 340/561; 340/562; 340/620; 324/682; 324/675
[58] Field of Search ..................... 327/100, 102, 327/104, 18, 509, 478, 514; 324/675, 652, 668, 682; 340/561, 562, 565, 620

[56] References Cited

U.S. PATENT DOCUMENTS

| | | | |
|---|---|---|---|
| 4,373,139 | 2/1983 | Beesley | 307/350 |
| 4,445,054 | 4/1984 | Ishii | 307/555 |
| 4,573,042 | 2/1986 | Boyd et al. | 340/539 |
| 5,150,062 | 9/1992 | Takeuchi | 324/675 |
| 5,239,284 | 8/1993 | Hara et al. | 340/539 |
| 5,479,122 | 12/1995 | Park | 327/18 |

*Primary Examiner*—Dinh T. Le
*Attorney, Agent, or Firm*—Brinks Hofer Gilson & Lione

[57] ABSTRACT

Between a reference voltage point and the emitter or the source of a transistor of which the collector or the drain is connected to a power source and to which an signal is input at its base or its gate, DC current passing means for causing a current to flow from the emitter or the source to the reference voltage point and a capacitor connected to the reference voltage point at one end and charged with a voltage generated in the DC current passing means are provided. A detection output for the signal is obtained from the emitter or the source of the transistor, or the other end of the capacitor.

16 Claims, 6 Drawing Sheets

FIG. 1
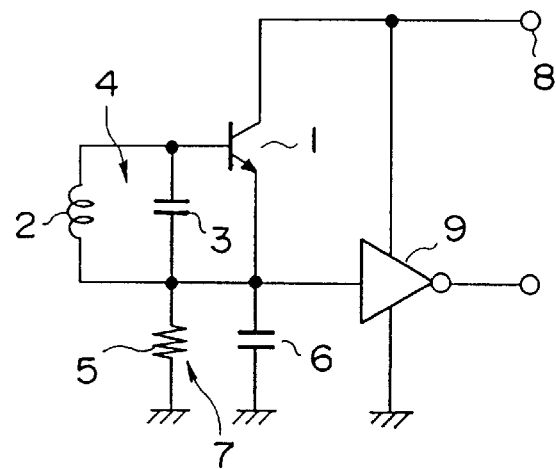
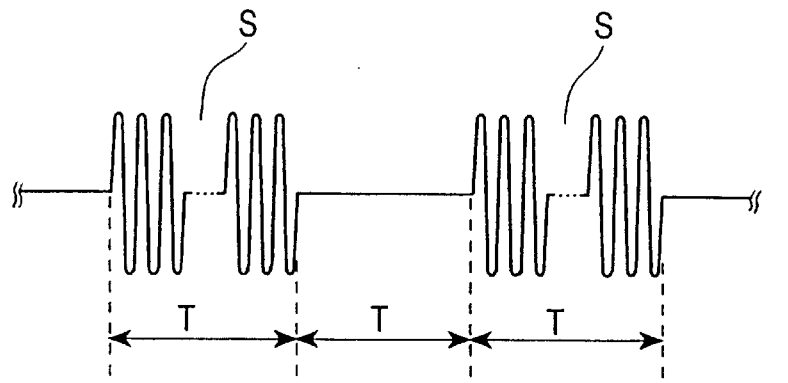
FIG. 2A
FIG. 2B
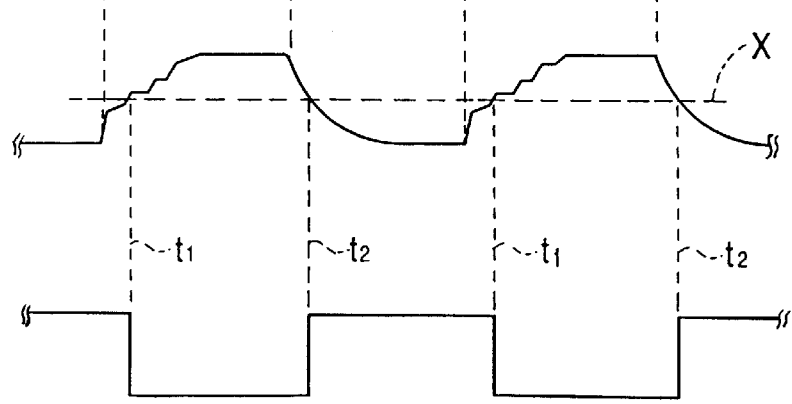
FIG. 2C

FIG. 9
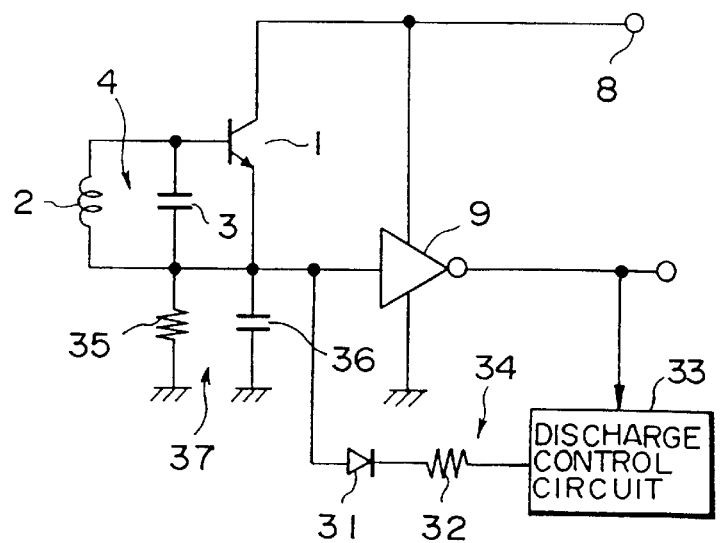
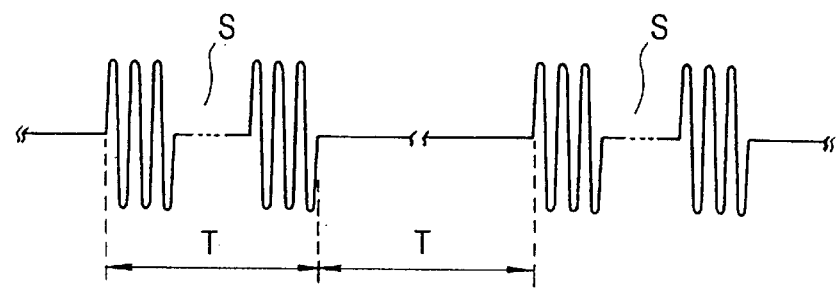
FIG. 10A
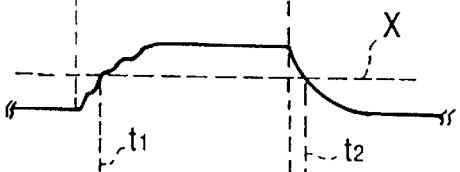
FIG. 10B
FIG. 10C
FIG. 10D
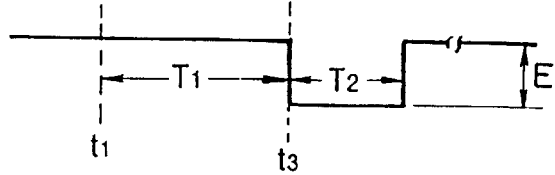

SIGNAL DETECTING CIRCUIT

BACKGROUND OF THE INVENTION

1. Field of the Invention

The present invention relates to a signal detecting circuit integrated into, for example, a general communication unit or an antitheft apparatus attached to an article, for reporting that a transmitted signal has been received.

2. Description of the Related Art

A conventional signal detecting circuit will be described below by referring to FIG. 15 with a signal detecting circuit for an antitheft apparatus attached to an article being taken as an example. Between the base and emitter of an npn transistor 51, a parallel resonant circuit 54 formed of a coil 52 and a capacitor 53 is connected. Therefore, the base and emitter of the transistor 51 have the same voltage. The resonant frequency of this parallel resonant circuit 54 is set such that it matches the frequency F of a signal to be received. The collector of the transistor 51 is connected to the base of a pnp transistor 56 through a load resistor 55. The emitter of the transistor 56 is connected to a power supply not shown through a terminal 57. The collector and emitter of the transistor 51 are connected to the collector and emitter of another npn transistor 58, respectively. A bias voltage is applied to the base of the transistor 58 through a diode 59 and a resistor 60 connected in series from the collector of the transistor 56. The base of the transistor 58 is also grounded through a time-constant circuit 63 formed of a capacitor 61 and a resistor 62 connected in parallel. Between the collector of the transistor 56 and the ground, alarm means 64 such as a buzzer is connected.

With the above configuration, when the parallel resonant circuit 54 receives, for example, a transmitted burst signal (hereinafter called just a signal) S at a specific frequency of F as shown in FIG. 16, the transistor 51 is turned on every positive half cycle because the base thereof is excited by the signal, and accordingly the transistor 56 is turned on. A voltage is intermittently applied to the collector of the transistor 56 from a power supply not shown. Therefore, a voltage is intermittently applied to the base of the transistor 58 through the diode 59 and the resistor 60. Since the signal S continues for a longer period (period T shown in FIG. 16) than the time constant of the time-constant circuit 63, the base voltage of the transistor 58 gradually rises during this period by a voltage with which the capacitor 61 of the time-constant circuit 63 is charged. The transistor 58 finally reaches a steady turn-on condition and the collector voltage thereof changes to almost 0 V. This change is fed back to the base of the transistor 56 and the base voltage of the transistor 56 decreases. As a result, the transistor 56 is also kept at the on state, a voltage from the power supply is applied to the alarm means 64, and it gives an alarm continuously.

This signal detecting circuit has been designed such that it is unlikely to malfunction against noise having a relatively short pulse width. When external noise having a shorter pulse width than the time constant of the time-constant circuit 63 is received, for example, even if the transistors 51 and 56 are temporarily turned on, since noise disappears while the base voltage of the transistor 58 has not yet sufficiently risen, the transistor 58 is not turned on. Therefore, the transistors 51 and 56 are turned off at a negative half cycle of the signal S and remain at the off state. A voltage is not applied to the alarm means 64 and an alarm is not given.

When the above conventional signal detecting circuit receives external noise having a shorter pulse width than the time constant of the time-constant circuit 63, even if the transistors 51 and 56 are temporarily turned on, the transistor 58 is not turned on due to the relationship between the pulse width of the external noise and the time constant of the time-constant circuit 63. Therefore, the transistor 56 is not continuously turned on. When noise having a longer pulse width than the time constant of the time-constant circuit 63 continues, however, the base voltage of the transistor 58 rises due to the time-constant circuit 63, and the transistor 58 is turned on. Once the transistor 58 is turned on, even if the external noise disappears, a voltage is continuously applied to the alarm means 64 and malfunction occurs.

To apply a voltage to the alarm means 64 when the transistor 58 is turned on, the base of the transistor 56 is grounded (the collector of the transistor 58 has almost 0 V when turned on) through the resistor 55. Therefore, a current continuously flows through a route formed of the transistor 56, the resistor 55, and the transistor 58 during an alarm or malfunction. The power consumed by the resistor 55 cannot be ignored. When a battery is used as a power source, this power consumption is a large problem.

This signal detecting circuit includes three transistors, 51, 56, and 58 and one diode 59. The number of components is not small and it increases the cost.

In the above conventional signal detecting circuit, the base and emitter of the transistor 51 have the same voltage due to the parallel resonant circuit 54 used for receiving a signal. Therefore, if a signal S input to the base does not exceed about 0.5 V, the transistor 51 is not turned on and receiving sensitivity is low.

SUMMARY OF THE INVENTION

Accordingly, it is an object of the present invention to provide a signal detecting circuit which solves at least one of the foregoing problems.

The foregoing object of the present invention is achieved through the provision of a signal detecting circuit including: a transistor of which the collector or the drain is connected to a power source and to which a signal is input at its base or its gate; DC current passing means disposed between a reference voltage point and the emitter or the source of the transistor, for causing a current to flow from the emitter or the source to the reference voltage point; and a capacitor disposed between the reference voltage point and the emitter or the source of the transistor, the capacitor connected to the reference voltage point at one end and charged with a voltage generated in the DC current passing means, wherein a detection output for the signal is obtained from the emitter or the source of the transistor, or the other end of the capacitor. The transistor is turned on every half cycle of an input signal and a current does not always flow through the transistor. Therefore, power consumption is low. In addition, a detection output of the specified level is obtained only when a signal continues for the specified period. Therefore, a detection output having the specified level is not obtained if a signal like a single pulse such as external noise is input, and malfunction is unlikely to occur.

The signal detecting circuit may further include discharging means provided at the other end of the capacitor, for releasing charges accumulated in the capacitor. In this case, a detection output can be obtained again if the next signal is input.

In the signal detecting circuit, a resistor may serve as both the DC current passing means and the discharging means. In this case, the configuration becomes simple and the signal detecting circuit can be achieved at low cost.

In the signal detecting circuit, the discharging means may serve as forcedly discharging means for forcedly releasing charges accumulated in the capacitor when the signal input to the base or the gate of the transistor disappears. In this case, discharging is positively performed even if the resistance of the resistor serving as the DC current passing means is increased. When the resistance of the resistor is increased, the transistor is saturated with a lower base current or the lower gate voltage, and a voltage drop across the resistor becomes large. Therefore, a signal can be detected even if the signal has a low level, and receiving sensitivity increases.

In the signal detecting circuit, a very low bias current may flow into the transistor. In this case, power consumption is suppressed when no signal is applied such as when a signal is awaited. In addition, because the bias current flows, even a low-level signal can be received. The circuit can be used with an increased receiving sensitivity.

The signal detecting circuit may further include a second transistor of which the base or the gate, and the emitter or the source are DC-connected to the base or the gate, and the emitter or the source of the transistor, respectively, and the collector or the drain is connected to the power source through a load resistor to form a current mirror circuit by the transistor and the second transistor. In this case, the bias current can be set within a very-low current range by the load resistor of the current mirror circuit. The circuit is also very stable against changes in ambient temperature.

The signal detecting circuit may further include a parallel resonant circuit resonating at the frequency of the signal, the parallel resonant circuit being connected between the base or the gate of the transistor and the base or the gate of the second transistor. In this case, a bias voltage can be applied to the bases or the gates through this parallel resonant circuit, and the circuit is simplified.

The signal detecting circuit may be configured such that the DC current passing means is formed of a constant-current source, and the current of the constant-current source is set slightly higher than the total current of the current mirror circuit. In this case, the emitter voltage or the gate voltage is maintained at almost 0 V when no signal is received, and the voltage sharply increases when a current increased by receiving is about to exceed the specified current of a transistor used in the constant-current source. Therefore, even a low-level signal can be detected. In addition, since the emitter voltage or the source voltage of the transistor sharply changes, even when a CMOS inverter is used for a waveform shaping circuit connected to the emitter or the source, a passing-through current does not flow into the inverter and power consumption of the power source is low.

In the signal detecting circuit, the constant-current source may be formed of a third transistor of which the collector or the drain is connected to the emitter or the source of the transistor and the emitter or the source is grounded, and a fourth transistor of which the base or the gate, and the emitter or the source are connected to the base or the gate, and the emitter or the source of the third transistor, respectively, and the collector or the drain is connected to the power source through a second load resistor to form a second current mirror circuit by the third transistor and the fourth transistor. In this case, the bias current becomes stable against temperature changes.

In the signal detecting circuit, the total current of the current mirror circuit and the current of the constant-current source may be specified by the load resistor of the second transistor constituting the first current mirror circuit and the second load resistor of the fourth transistor constituting the second current mirror circuit. Therefore, the currents can be easily specified.

BRIEF DESCRIPTION OF THE DRAWINGS

FIG. 1 shows a signal detecting circuit according to a first embodiment of the present invention.

FIG. 2a is a view showing a signal S input to the base of a transistor 1 shown in FIG. 1.

FIG. 2b is a view showing the output signal of the emitter of the transistor 1 shown in FIG. 1.

FIG. 2c is a view showing the output signal of an inverter 9 shown in FIG. 1.

FIG. 9 shows a signal detecting circuit according to a third embodiment of the present invention.

FIG. 10a is a view showing a received signal S of the signal detecting circuit shown in FIG. 9.

FIG. 10b is a view showing the output signal of the emitter of the transistor 1 shown in FIG. 9.

FIG. 10c is a view showing the output signal of an inverter 9 shown in FIG. 9.

FIG. 10d is a view showing the output signal of a discharging control circuit 33 shown in FIG. 9.

DESCRIPTION OF THE PREFERRED EMBODIMENTS

Figure 3:
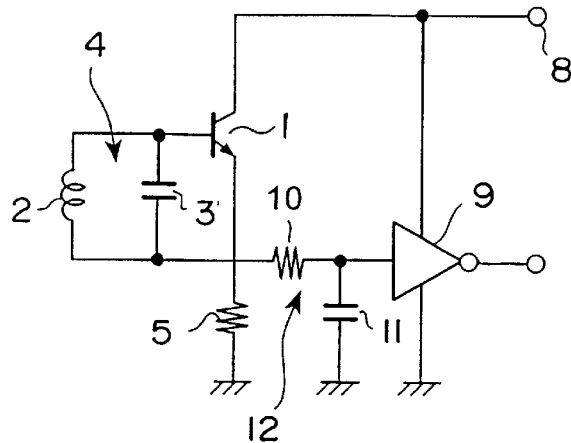
FIG. 3 shows a first modification of the signal detecting circuit according to the first embodiment of the present invention.

Signal detecting circuits according to the present invention will be described below by referring to FIGS. 1 to 14. FIG. 1 shows a signal detecting circuit according to a first embodiment of the present invention. FIG. 2 is a chart describing an operation thereof.

In FIG. 1, between the base and emitter of an npn bipolar transistor (hereinafter called just a transistor) 1, a parallel resonant circuit 4 formed of a coil 2 and a capacitor 3 and resonating at the frequency F of a transmitted signal is connected. Therefore, the base and emitter of the transistor 1 have the same voltage due to the coil 2. Between the emitter of the transistor 1 and a reference voltage point (hereinafter called just the ground) such as the ground, a resistor 5 serving as DC current passing means through which the emitter current of the transistor 1 flows and a capacitor 6 serving as charge means for being charged with a voltage generated across the resistor 5 are connected in parallel. The resistor 5 and the capacitor 6 connected in parallel form a time-constant circuit 7, and its time constant is set longer than the period of the signal S. The collector of the transistor 1 is connected to a power supply not shown through a terminal 8, and the emitter thereof is connected to alarm means not shown through an inverter 9 serving as a waveform shaping circuit made from CMOS in view of current consumption.

A burst signal (hereinafter called just a signal) S shown in FIG. 2(a) is input to the base of the transistor 1 in the signal detecting circuit having the above structure. The burst signal S has, for example, a frequency F of 33 kHz, a repetition frequency of 512 Hz, and a duty cycle of 50% (a period in which the signal S exists and a period in which the signal does not exist are T). The transistor 1 is turned on during a positive half cycle of the signal S. Since the time constant of the time-constant circuit 7 is set sufficiently longer than the period of the signal S, the capacitor 6 is charged during a continuity period T of the signal S, and is discharged through the resistor 5 when the period elapses. At the emitter of the transistor 1, a detection output shown in FIG. 2(b) is obtained. Therefore, the resistor 5 serves as discharging means with charges accumulated in the capacitor 6. When this detection output is input to the inverter 9, the inverter 9 is turned on or off (on at $t_1$ and off at $t_2$) at a threshold level X and a shaped detection output as shown in FIG. 2(c) is obtained from the inverter 9. This shaped detection output is input to the alarm means not shown.

Figure 4:
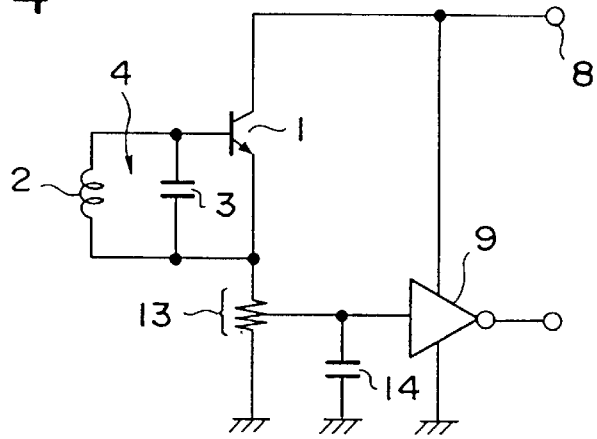
FIG. 4 shows a second modification of the signal detecting circuit according to the first embodiment of the present invention.

In the first embodiment, the transistor 1 is tuned on at a half cycle of the signal S and the inverter 9 operates only when the signal S continues for the specified period T. Therefore, since an emitter voltage required for operating the inverter 9 is not generated for a signal like a single pulse such as external noise, malfunction does not occur. As described above, since the resistor 5 serves as both DC current passing means and discharging means, the emitter voltage of the transistor 1 decreases when the signal S disappears, and a charging operation restarts when the next signal is input and a detection output is obtained. In addition, since the signal detecting circuit is formed of the resistor 5 and the capacitor 6 in the time-constant circuit 7 and the transistor 1, the circuit is simplified. The time-constant circuit 7 shown in FIG. 1 is formed of the resistor 5 serving as DC current passing means and the capacitor 6 connected in parallel to the resistor 5. The resistor 5 may be connected to an integrating circuit 12 formed of a resistor 10 and a capacitor 11 serving as charge means, as shown in FIG. 3. Alternatively, a part of a resistor 13 serving as DC current passing means may be connected in parallel to a capacitor 14 serving as charge means, as shown in FIG. 4. The circuit needs to be provided with DC current passing means, charge means, and discharging means. A detection output is taken out from the capacitor 11 or 14 in FIG. 3 or 4. It may be taken out from the emitter of the transistor 1.

Figure 5:
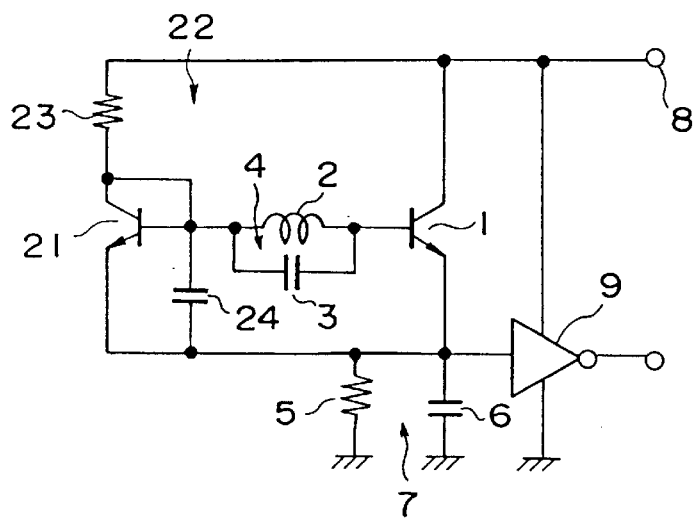
FIG. 5 shows a signal detecting circuit according to a second embodiment of the present invention.

A signal detecting circuit according to a second embodiment of the present invention will be described below by referring to FIG. 5. The same numerals as those used in FIG. 1 are assigned to the same portions as those shown in FIG. 1. In FIG. 5, the base of the transistor 1 is DC-connected to the base of another transistor (hereinafter called a second transistor) 21 through a parallel resonant circuit 4. The second transistor 21 forms a current mirror circuit 22 together with the transistor 1. The collector and base of the second transistor 21 are connected, the collector is also connected to a terminal 8 through a load resistor 23, and the emitter is connected to the emitter of the transistor 1. The base of the second transistor 21 is connected to the emitter through a bypass capacitor 24 which has a low impedance at the frequency F of a signal S.

Since the transistor 1 and the second transistor 21 form the current mirror circuit 22, the voltage between the base and emitter of the transistor 1 is equal to that between the base and emitter of the second transistor 21. Therefore, the collector current of the transistor 1 equals the collector current of the second transistor 21. In this embodiment, the load resistor 23 of the second transistor 21 is set such that a very low collector bias current, for example a nano-order ampere current, flows into the transistor 1 in order that the transistor 1 is turned on even with a low-level signal (signal having a small amplitude) S.

With this configuration, when the signal S is received, both ends of the parallel resonant circuit 4, that is, the base of the transistor 1 and the base of the second transistor 21, are excited. Since the bypass capacitor 24 is connected to the base of the second transistor 21, the received signal S effectively appears only at the base of the transistor 1, and the transistor 1 is turned on. Since a very low bias current flows into the transistor 1, power consumption is suppressed when no signal is input, for example when a signal is awaited. In addition, a low-level signal S can be received due to a bias current, and receiving sensitivity can be increased. Because the transistor 1 is a part of the current mirror circuit, the bias current is set within a very low current range only by the load resistor 23 and is stable against a change in ambient temperature. Since the parallel resonant circuit 4 is connected between the base of the transistor 1 and that of the transistor 21, a bias voltage is easily applied to the transistor 1 through this parallel resonant circuit 4.

Figure 6:
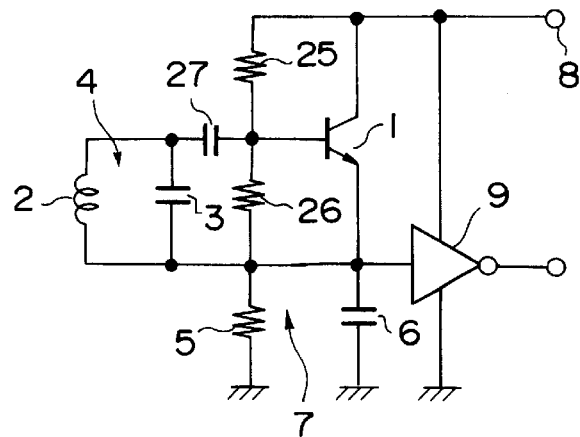
FIG. 6 shows a first modification of the signal detecting circuit according to the second embodiment of the present invention.
Figure 7:
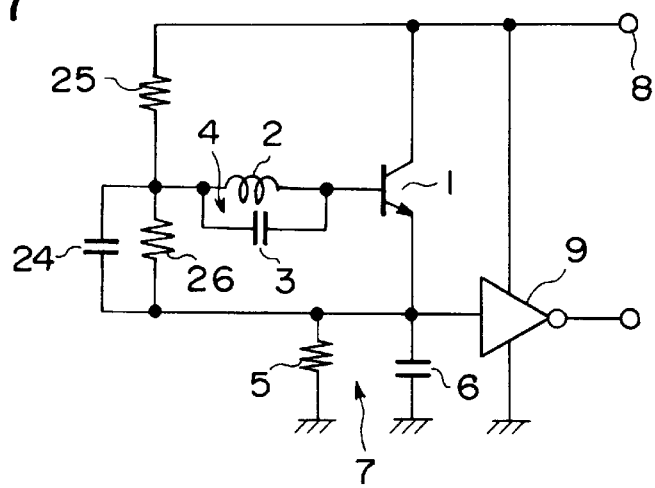
FIG. 7 shows a second modification of the signal detecting circuit according to the second embodiment of the present invention.
Figure 8:
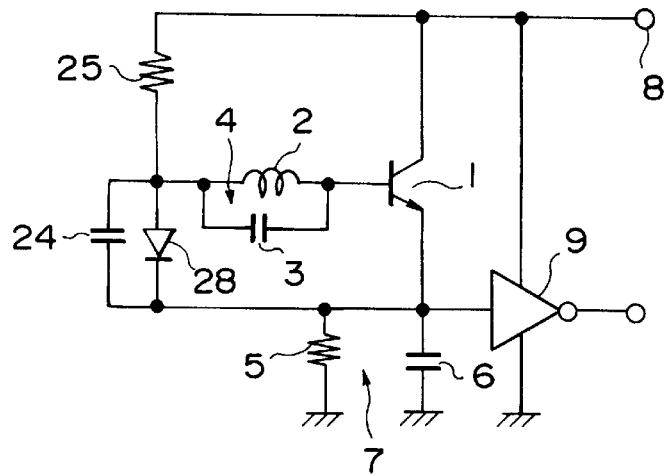
FIG. 8 shows a third modification of the signal detecting circuit according to the second embodiment of the present invention.

In order that a very low bias current flows into the transistor 1, a voltage divided by bias resistors 25 and 26 may be applied to the base of the transistor 1 as shown in FIG. 6, instead of forming the current mirror circuit 22 shown in FIG. 5. In this case, a DC blocking capacitor 27 is inserted between the parallel resonant circuit 4 and connection point of bias resistors 25 and 26. As shown in FIG. 7, a bias voltage may be applied by connecting the parallel resonant circuit 4 between the base of the transistor 1 and the connection point of the resistors 25 and 26. In this case, the connection point of the resistors 25 and 26 is connected to the emitter of the transistor 1 through the bypass capacitor 24. Instead of the resistor 26 shown in FIG. 7, a diode 28 may be used as shown in FIG. 8. In this case, a base bias voltage of the transistor 1 is produced by the forward-direction voltage of the diode 28.

A signal detecting circuit according to a third embodiment of the present invention will be described below by referring to FIG. 9 and FIG. 10. The same numerals as those used in FIG. 1 are assigned to the same portions as those shown in FIG. 1. The third embodiment differs from the first embodiment shown in FIG. 1 in view of a circuit configuration in that a forcedly discharging means 34 formed of a diode 31, a resistor 32, and a discharge control circuit 33 is added between the emitter of the transistor 1 and the output of the inverter 9. The emitter of the transistor 1 is connected to the discharge control circuit 33 through the diode 31 and the resistor 32 in series, and the discharge control circuit 33 is connected to the output of the inverter 9. The discharge control circuit 33 is formed of, for example, a one-chip microcomputer. In response to this circuit configuration, the time constant of a time-constant circuit 37 formed of a resistor 35 and a capacitor 36 and connected to the emitter of the transistor 1 is set longer than that of the time-constant circuit 7 shown in FIG. 1 by setting the resistance of the resistor 35 about five times larger than the resistor 5 shown in FIG. 1.

Since the resistor 35 of the time-constant circuit 37 serves as a load resistor of the transistor 1, when the resistance of the resistor 35 is set larger, the transistor 1 is saturated with a lower base current and the voltage drop across the resistor 35 becomes higher. Therefore, a large detection output can be obtained even if a signal S has a low level, and receiving sensitivity increases. Since the resistor 35 is set larger, however, it takes a long time to discharge the charged capacitor 36, and discharging may not be finished before the next signal S is input. To solve this problem, the forcedly discharging means 34 formed of the diode 31, the resistor 32, and the discharge control circuit 33 is provided. A signal S shown in FIG. 10(*a*) is received, the emitter voltage of the transistor 1 increases as shown in FIG. 10(*b*), and the inverter 9 is turned on at time $t_1$ and off at time $t_2$ at the threshold level X as shown in FIG. 10(*c*). A falling-edge signal SF at time $t_1$ is also input to the discharge control circuit 33. A time period $T_1$ equal to that from the time $t_1$ to a time $t_3$ when the signal S disappears is specified in advance in the discharge control circuit 33, and the circuit outputs a negative voltage E at time $t_3$ as shown in FIG. 10(*d*). With this signal, the charged capacitor 36 is discharged through the resistor 32. The discharging resistor 32 is set smaller than the resistor 35 to reduce the discharging time. A time period $T_2$ during which the negative voltage E remains is set such that discharging is finished before the next signal S is input.

Figure 11:
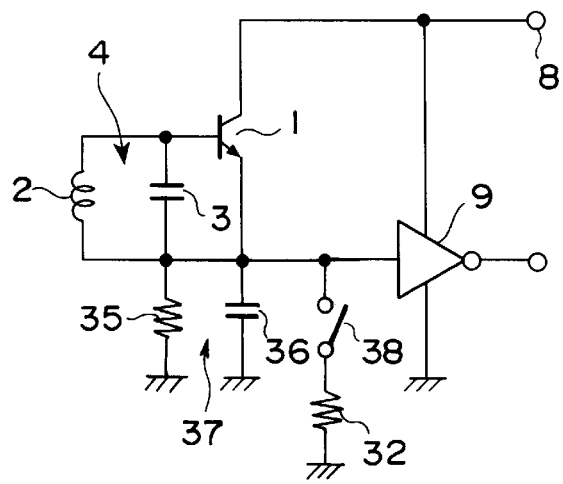
FIG. 11 shows a modification of the signal detecting circuit according to the third embodiment of the present invention.

As described above, in the third embodiment, the DC current passing resistor 35 connected to the emitter of the transistor 1 is set larger to increase the receiving sensitivity, and a delay in the discharging time due to the increased resistance of the resistor 35 is reduced by the forcedly discharging means 34 formed of the diode 31, the discharging resistor 32, and the discharge control circuit 33. The inverter 9 may be included in the one-chip microcomputer serving as the discharge control circuit 33. The signal detecting circuit may be configured as shown in FIG. 11 such that the emitter of the transistor 1 is grounded by the discharging resistor 32 through a contact 38 of a relay, for example, and the coil (not shown) of the relay is driven by the discharge control circuit 33 to close the contact 38.

Figure 12:
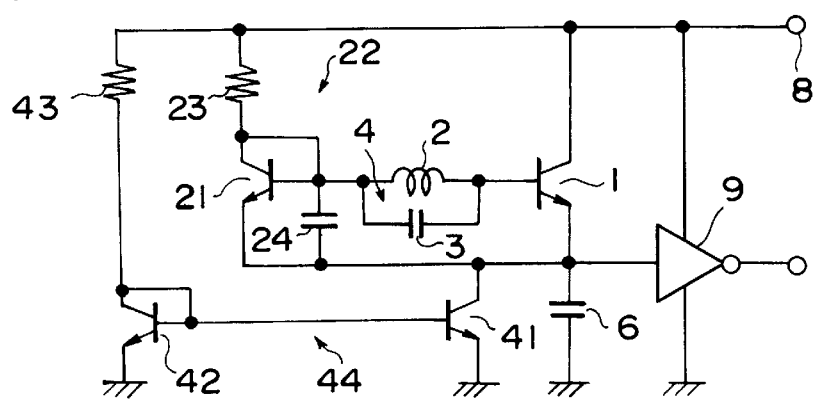
FIG. 12 shows a signal detecting circuit according to a fourth embodiment of the present invention.
Figure 13:
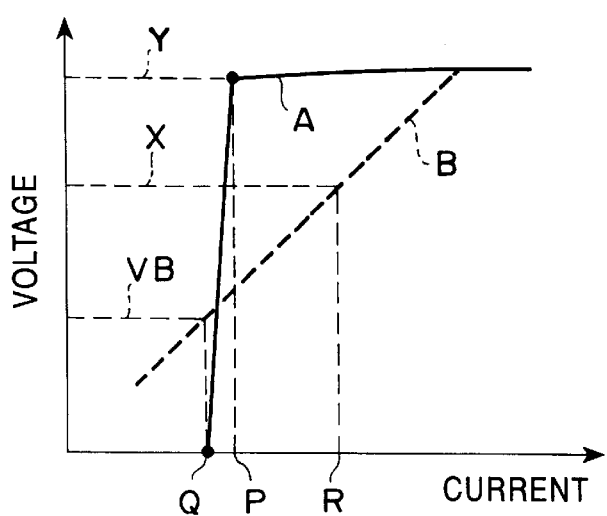
FIG. 13 is a chart illustrating an operation of the signal detecting circuit according to the fourth embodiment of the present invention.

A signal detecting circuit according to a fourth embodiment of the present invention will be described below by referring to FIG. 12 and FIG. 13. FIG. 12 is a circuit diagram of the signal detecting circuit according to the fourth embodiment of the present invention, and FIG. 13 is a chart illustrating its operation. The same numerals as those used in the second embodiment shown in FIG. 5 are assigned to the same portions as those shown in FIG. 5. In FIG. 12, a transistor 41 (hereinafter called a third transistor) is connected (the emitter thereof is connected to the ground) in parallel to the capacitor 6 serving as charge means between the emitter of the transistor 1 and the ground. The base of the third transistor 41 is connected to the base of a transistor 42 (hereinafter called a fourth transistor), and the fourth transistor is inserted between the terminal 8 and the ground. The collector of the fourth transistor 42 is connected to a power supply through a load resistor 43, and the collector and the base thereof are connected.

The third transistor 41 and the fourth transistor 42 form a second current mirror circuit 44. Therefore, the fourth embodiment shown in FIG. 12 includes two current mirror circuits, the current mirror circuit 22 formed of the transistor 1 and the second transistor 21 and the second current mirror circuit 44 formed of the third transistor 41 and the fourth transistor 42. The third transistor 41 serves as a constant-current source for the current mirror circuit 22. The current flowing through the third transistor 41 is set slightly higher than the total current (hereinafter called the total current of the current mirror circuit 22) of the bias current of the transistor 1 and the bias current of the second transistor 21 in the current mirror circuit 22. This setting is performed by the load resistor 23 of the second transistor 21 in the current mirror circuit 22 and the load resistor 43 of the fourth transistor 42 in the second current mirror circuit 44. In the fourth embodiment, the load resistor 23 has 10 MΩ and the load resistor 43 has 4.7 MΩ. The second current mirror circuit 44 and the load resistor 43 form a current comparator.

When a signal S is received in this condition, a current flowing through the transistor 1 increases. Even if the total current of the current mirror circuit increases, since the third transistor 41 in the second current mirror circuit 44 serves as a constant-current source, the current cannot exceed the specified constant current. Therefore, when the total current of the current mirror circuit 22 is about to exceed the current of the third transistor 41 in the second current mirror circuit 44, the emitter voltage of the transistor 1 and the emitter voltage of the second transistor 21 in the current mirror circuit 22 sharply rise. This phenomenon is caused by the operation of the current comparator. This is because the third transistor 41, which is one of transistors forming the second current mirror circuit 44, serves as DC current passing means for the current mirror circuit 22 and it is also a constant-current source.

FIG. 13 shows the operation thereof. The horizontal axis represents the total current of the current mirror circuit 22 and the vertical axis represents the emitter voltage of the transistor 1 and the transistor 21 in the current mirror circuit 22. In FIG. 13, the present embodiment (indicated by a solid line A) shown in FIG. 12 in which the constant-current source serves as the DC current passing means of the transistor 1 and the embodiment shown in FIG. 5 (indicated by a dotted line B) in which the resistor 5, instead of the constant-current source, is used as the DC current passing means of the transistor 1 are compared. In the case indicated by the solid line A, since the total current (point Q in FIG. 13) specified for the current mirror circuit 22 is lower than the current (point P in FIG. 13) specified for the third transistor 41 serving as the DC current passing means when a signal S is not received, the total current of the current mirror circuit 22 flows through the third transistor 41 of the second current mirror circuit 44 and the third transistor 41 is saturated. Therefore, the emitter voltage of the transistor 1 and the second transistor 21 in the current mirror circuit is almost 0 V. This condition corresponds to point Q in FIG. 13.

When a current P specified for the third transistor 41 in the second current mirror circuit 44 is set slightly higher than the total current Q of the current mirror circuit 22, if the current of the transistor 1 increases due to receiving of a signal S and is about to exceed P, it cannot increase any more since it is limited by the constant current P of the third transistor 41. The third transistor 41 enters a saturation condition, and the emitter voltage of the transistor 1 and the transistor 21 in the current mirror circuit 22 sharply rises to a voltage X. In other words, the emitter voltage of the transistor 1 and the transistor 21 is maintained at 0 V until the current of the transistor 1 exceeds the current specified for the third transistor 41 in the second current mirror circuit 44, and the emitter voltage sharply rises to a voltage Y when the current of the transistor 1 is about to exceed the current specified for the third transistor 41 since the third transistor 41 is saturated.

On the other hand, in the case indicated by the dotted line B, since the current (Q) specified for the current mirror circuit 22 flows through the resistor 5 even if no signal is input, a voltage VB is generated at the emitters of the transistor 1 and the second transistor 21. The emitter voltage of the transistor 1 and the second transistor 21 increases almost straight as the solid line A as the level of the signal S increases. The CMOS inverter 9 serving as a waveform shaping circuit operates when the signal reaches the level at which a necessary current R flows at the threshold level X of the inverter 9.

Figure 14:
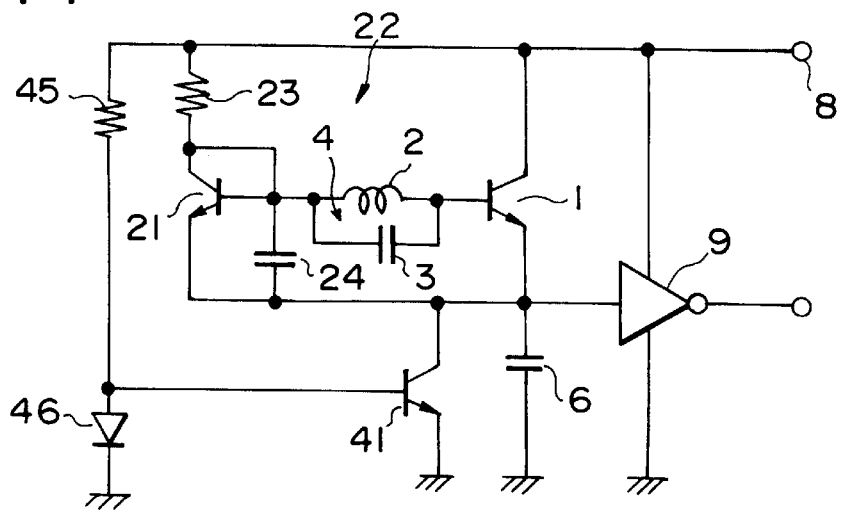
FIG. 14 shows a modification of the signal detecting circuit according to the fourth embodiment of the present invention.
Figure 15:
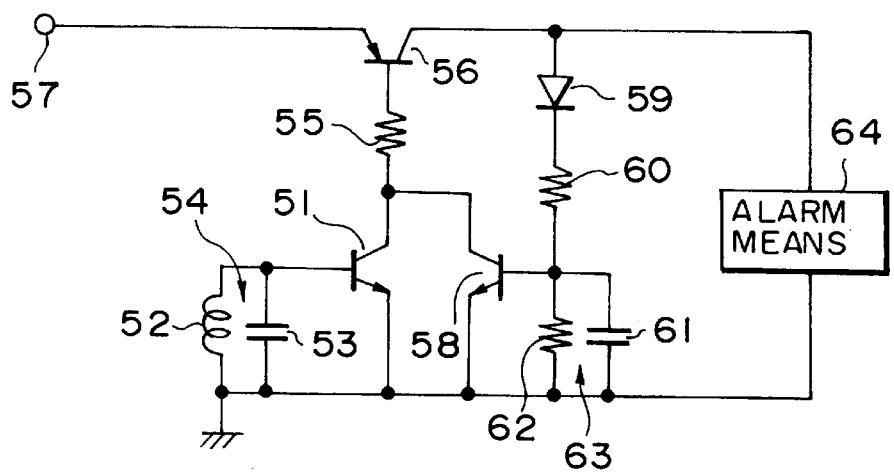
FIG. 15 shows a conventional signal detecting circuit.
Figure 16:
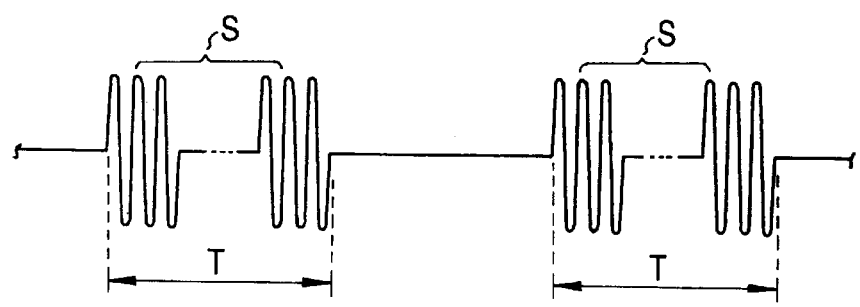
FIG. 16 is a chart showing a burst signal.

Therefore, a voltage input to the inverter 9 is 0 V or voltage Y in the case indicated by the solid line A and an intermediate voltage therebetween is substantially not input. On the other hand, in the case of the dotted line B, a voltage continuously increasing from the VB voltage to the X voltage is input. When the inverter 9 is made from CMOS, if a voltage close to the threshold level X is applied, a large power-source current called a passing-through current generally flows which is higher than a current flowing when the inverter is turned on or off. From this point of view, it is superior to use the constant-current source formed of the third transistor 41 as the DC current passing means of the transistor 1 to implement the operation indicated by the solid line A. Since with this configuration the emitter voltage of the transistor 1 and the second transistor 21 can be changed largely even if the signal S has a low level, receiving sensitivity increases. In addition, with the use of the second current mirror circuit 44, a stable operation is obtained against temperature changes. The constant-current source may be configured as shown in FIG. 14 without using the second current mirror circuit 44 such that a voltage divided by a resistor 45 and a diode 46 is applied to the base of the transistor 41 as a bias voltage. In this case, the current of the transistor 41 is set by the resistor 45.

In the above embodiments, bipolar transistors are used. Field effect transistors (FETs) may be used instead of bipolar transistors to implement this invention. In this case, collectors need to be replaced with drains, bases with gates, and emitters with sources in the embodiments. A low-voltage operation can be achieved when an FET in which a high drain current flows at a low gate voltage is used. Bipolar transistors are not limited to those of npn type and pnp-type bipolar transistors may be used.

What is claimed is:

1. A signal detecting circuit comprising:
   a first bipolar transistor, wherein a collector of said first bipolar transistor is connected with a power source;
   a direct current passing means disposed between a reference voltage point and an emitter of said first bipolar transistor, for causing a direct current to flow from said emitter to said reference voltage point;
   a capacitor having two ends and disposed between said reference voltage point and said emitter of said first bipolar transistor, said capacitor connected with said reference voltage point at one end and the other end of said capacitor connected with said emitter of said first bipolar transistor, said capacitor charged with a voltage generated in said a direct current passing means; and
   a resonant circuit connected between a base and said emitter of said bipolar transistor, said resonant circuit resonant at a frequency of a burst signal to be transmitted and operative to input a signal of predetermined frequency to said base of said first bipolar transistor;
   wherein a detection output for said signal is obtained from said end of said capacitor connected with said emitter of said first bipolar transistor.

2. A signal detecting circuit according to claim 1, further comprising discharging means provided at said end of said capacitor connected with said emitter of said first bipolar transistor, for releasing charge accumulated in said capacitor while said burst signal is not provided.

3. A signal detecting circuit according to claim 2, wherein said a direct current passing means also serves as said discharging means and comprises a resistor.

4. A signal detecting circuit according to claim 1, further comprising a biasing circuit, said biasing circuit operative to flow a biasing current between said base and said emitter of said first bipolar transistor such that said transistor is turned on even with a low level burst signal.

5. A signal detecting circuit according to claim 4, further comprising a first current mirror circuit, said first current mirror formed by connecting said first bipolar transistor with a second bipolar transistor such that:
   said base of said first bipolar transistor is connected with a base of said second bipolar transistor;
   said emitter of said first bipolar transistor is connected with an emitter of said second bipolar transistor;
   a collector of said second bipolar transistor is connected with said power source through a first load resistor;
   said resonant circuit being connected between said base of said first bipolar transistor and said base of said second bipolar transistor.

6. A signal detecting circuit according to claim 5, wherein said DC current passing means comprises a constant-current source, said constant-current source comprising a current-value setting means wherein a current of said constant-current source is set by said current-value setting means to be slightly higher than a total current of said first current mirror circuit.

7. A signal detecting circuit according to claim 6, wherein said constant-current source comprises a second current mirror circuit, said second current mirror circuit comprises a third bipolar transistor and a fourth bipolar transistor;
   wherein a collector of said third bipolar transistor is connected to said emitter of said first bipolar transistor and an emitter of said third bipolar transistor is connected to ground;
   wherein a base of said fourth bipolar transistor is connected to a base of said third bipolar transistor and an emitter of said fourth bipolar transistor is connected to said emitter of said third bipolar transistor; and
   wherein a collector of said fourth bipolar transistor is connected to said power source through a second load resistor.

8. A signal detecting circuit according to claim 7, wherein the total current of said first current mirror circuit and the current of said constant-current source are specified by said first load resistor of said second bipolar transistor constituting said first current mirror circuit and the second load resistor of said fourth bipolar transistor constituting said second current mirror circuit.

9. A signal detecting circuit comprising:
a first field effect transistor, wherein a drain of said first field effect transistor is connected with a power source;
a direct current passing means disposed between a reference voltage point and a source of said first field effect transistor, for causing a direct current to flow from said source to said reference voltage point;
a capacitor having two ends and disposed between said reference voltage point and said source of said first field effect transistor, said capacitor connected with said reference voltage point at one end and the other end of said capacitor connected with said source of said first field effect transistor, said capacitor charged with a voltage generated in said direct current passing means; and
a resonant circuit connected between a gate and said source of said first field effect transistor, said resonant circuit resonant at a frequency of a burst signal to be transmitted and operative to input a signal of predetermined frequency to said gate of said first field effect transistor;
wherein a detection output for said signal is obtained from said end of said capacitor connected with said source of said first field effect transistor.

10. A signal detecting circuit according to claim 9, further comprising discharging means provided at said end of said capacitor connected with said source of said first field effect transistor, for releasing charge accumulated in said capacitor while said burst signal is not provided.

11. A signal detecting circuit according to claim 10, wherein said direct current passing means also serves as said discharging means and comprises a resistor.

12. A signal detecting circuit according to claim 9, further comprising a biasing circuit, said biasing circuit operative to flow a biasing current between said gate and said source of said first field effect transistor such that said first field effect transistor is turned on even with a low level burst signal.

13. A signal detecting circuit according to claim 12, further comprising a first current mirror circuit, said first current mirror formed by connecting said first field effect transistor with a second field effect transistor such that:
said gate of said first field effect transistor is connected with a gate of said second field effect transistor;
said source of said first field effect transistor is connected with a source of said second field effect transistor;
a collector of said second field effect transistor is connected with said power source through a first load resistor;
said resonant circuit is connected between said gate of said first field effect transistor and said gate of said second field effect transistor.

14. A signal detecting circuit according to claim 13, wherein said DC current passing means comprises a constant-current source, said constant-current source comprising a current-value setting means wherein a current of said constant-current source is set by said current-value setting means to be slightly higher than a total current of said first current mirror circuit.

15. A signal detecting circuit according to claim 14, wherein said constant-current source comprises a second current mirror circuit, said second current mirror circuit comprises a third field effect transistor and a fourth field effect transistor;
wherein a drain of said third field effect transistor is connected to said source of said first field effect transistor and a source of said third field effect transistor is connected to ground;
wherein a gate of said fourth field effect transistor is connected to a gate of said third field effect transistor and a source of said fourth field effect transistor is connected to said source of said third field effect transistor; and
wherein a drain of said fourth field effect transistor is connected to said power source through a second load resistor.

16. A signal detecting circuit according to claim 15, wherein the total current of said first current mirror circuit and the current of said constant-current source are specified by said first load resistor of said second field effect transistor constituting said first current mirror circuit and the second load resistor of said fourth field effect transistor constituting said second current mirror circuit.

* * * * *